United States Patent [19]
Krames et al.

[11] Patent Number: 5,779,924
[45] Date of Patent: Jul. 14, 1998

[54] ORDERED INTERFACE TEXTURING FOR A LIGHT EMITTING DEVICE

[75] Inventors: Michael R. Krames, Mountain View; Fred A. Kish, Jr., San Jose, both of Calif.

[73] Assignee: Hewlett-Packard Company, Palo Alto, Calif.

[21] Appl. No.: 620,518

[22] Filed: Mar. 22, 1996

[51] Int. Cl.$^6$ ................................................ B44C 1/22
[52] U.S. Cl. ................................................ 216/24; 216/41
[58] Field of Search .......................... 216/2, 24, 41; 156/649.1, 654.1, 655.1, 659.11

[56] References Cited

U.S. PATENT DOCUMENTS

| | | |
|---|---|---|
| 4,225,380 | 9/1980 | Wickens. |
| 5,601,731 | 2/1997 | Hillmer ............ 216/24 X |

FOREIGN PATENT DOCUMENTS

| | | |
|---|---|---|
| 0404565 | 12/1990 | European Pat. Off.. |
| 0442002 | 8/1991 | European Pat. Off.. |
| 2221791 | 2/1990 | United Kingdom. |
| 2296378 | 6/1996 | United Kingdom. |

OTHER PUBLICATIONS

Infrared Physics, 1966, vol. 6, pp. 1–19, Pergamon Press Ltd., "Photometric Figures of Merit for Semiconductor Luminescent Sources Operating in Spontaneous Mode", W. N. Carr.

Applied Physics Letters, Aug. 15, 1971, vol. 19, No. 4, pp. 98–100, "Efficient Electroluminescence from Zinc-Diffused Ga 1-x Al x As Diodes at 25 C", E.G. Dierschke, L.E. Stone & R. W. Haisty.

Optica ACTA, 1982, vol. 29, No. 7, pp. 993–1009; "The Optical Properties of Moth Eye" Antireflection Surfaces, S.J. Wilson & M.C. Hutley.

Applied Optics, vol. 25, No. 24, Dec. 15, 1986, pp. 4562–4567; "Zero-Reflectively High Spatial-Frequency Rectangular-Groove Dielectric Surface-Relief Gratings", Thomas K. Gaylord, W.E. Baird & M.G. Moharam.

Applied Physics Letter, vol. 57, No. 22, Nov. 26, 1990; "Strongly Directional Emission From AlGaAs/GaAs Light-Emitting Diodes", A.Kock, E. Gornik, M. Hauser & W. Beinstingl; pp. 2327–2329.

Applied Physics Letter, vol. 62, No. 2, Jan. 11, 1993, pp. 131–133; "Ultrahigh Spontaneous Emission Quantum Efficiency, 99.7% Internally and 72% Externally, From AlGaAs/GaAs/AlGaAs Double Heterostructures", I. Schnitzer, E. Yablonovitch, C. Caneau & T.J. Gmitter.

Applied Physics Letter, Vo. 62, No. 16, Oct. 18, 1993, pp. 2174–2176; "30% External Quantum Efficiency From Surface Textured, Thin-Film Light-Emitting Diodes", I. Schnitzer, E. Yablonovitch, C. Caneau, T.J. Gmitter & A. Scherer.

*Primary Examiner*—William Powell
*Attorney, Agent, or Firm*—Pamela Lau Kee

[57] ABSTRACT

This method relates to the fabrication of semiconductor light-emitting devices having at least one ordered textured interface. Controlled interface texturing with an ordered pattern is provided on any or all interfaces of such a device to enhance light extraction from these interfaces and thus improve the performance of the device.

Ordered interface texturing offers an improvement in light extraction by increasing the transmission of total optical power from the device into the ambient. This improvement is possible because ordered interface texturing can provide: 1) a reduction in Fresnel losses at the interface between the device and the ambient and, 2) a change or increase in the angular bandwidth of light which may transmit power into the ambient. This latter effect may be thought of as a change or increase in the escape cone at an interface. Both effects can result in an overall increase in total light extraction efficiency for the LED.

22 Claims, 16 Drawing Sheets

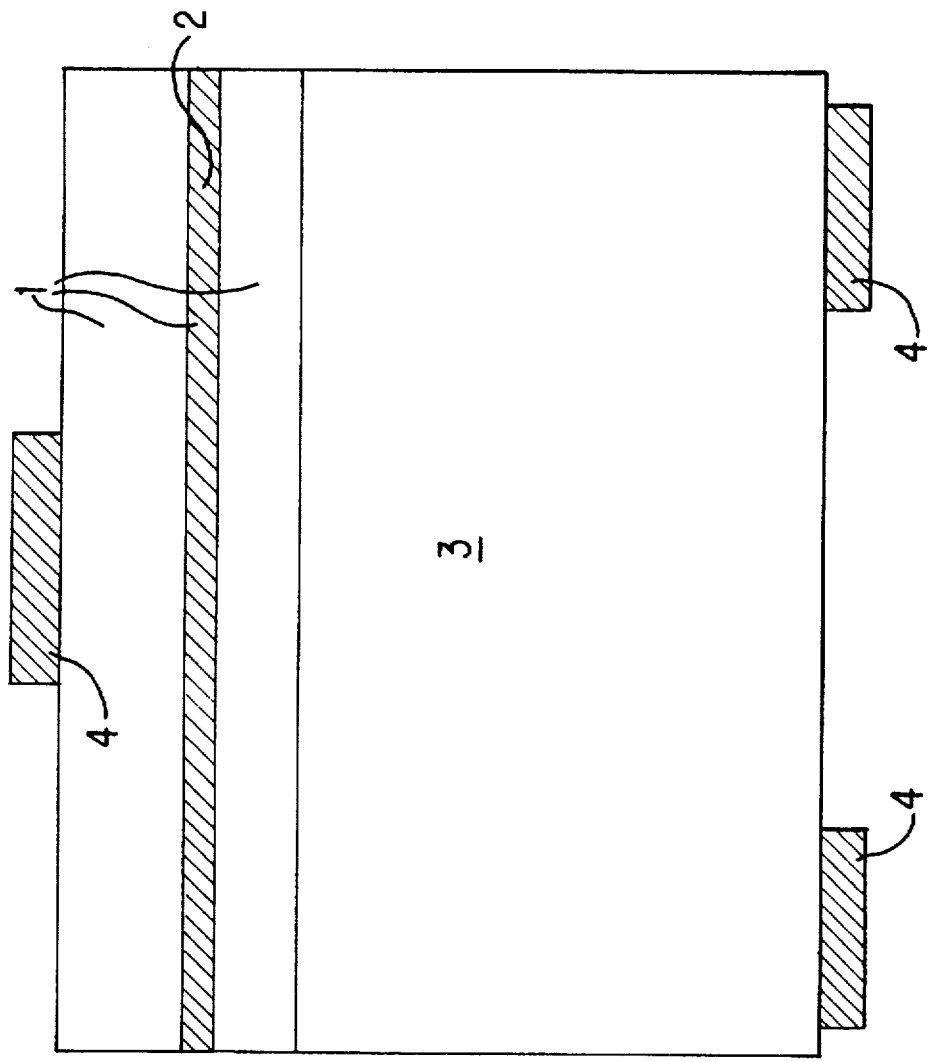

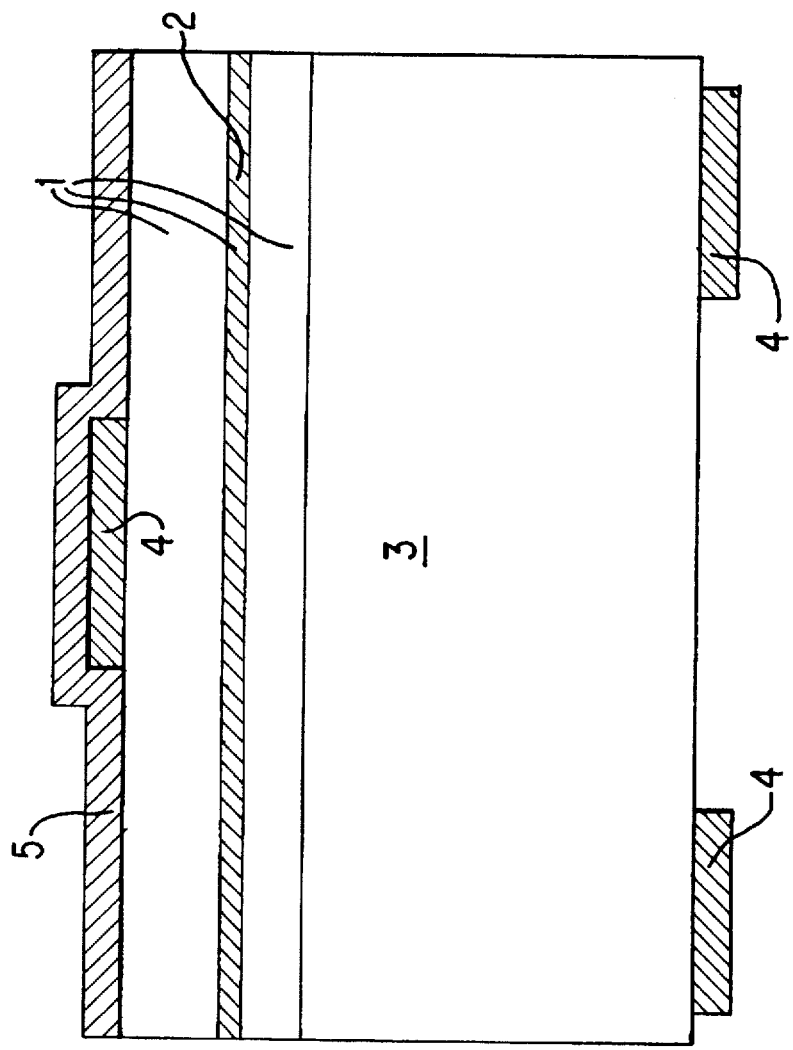

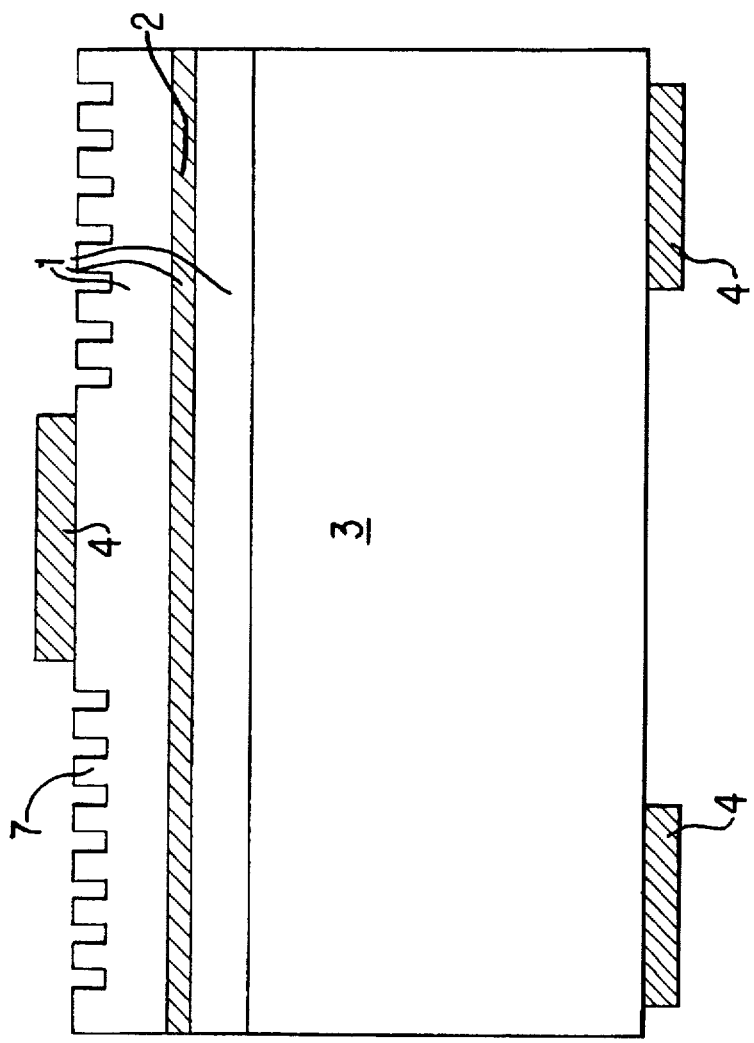

ORDERED INTERFACE TEXTURING FOR A LIGHT EMITTING DEVICE

FIELD OF THE INVENTION

This invention relates to the manufacture of semiconductor light-emitting devices. In particular, the invention is directed towards improving light extraction from such devices.

BACKGROUND OF THE INVENTION

Light extraction from a semiconductor light-emitting device (LED) is typically limited due to the large optical refractive index, (n~2.2–3.8) of the semiconductor material relative to the surrounding ambient, typically air (n~1) or transparent epoxy (n~1.5). The amount of extraction depends heavily on the macroscopic geometry of the LED and the three-dimensional emission profile of light generated within the active region. The light emitting capability of the active region is defined by the structure of the surrounding materials such as the epitaxial layers, confining regions, etc..

The problem of light extraction from a semiconductor may be understood using an example from elementary electromagnetics: an electromagnetic plane wave that is incident from one medium (I) to another (II) must satisfy a phase-matching condition at the interface between the two media in order to be transmitted. Waves that do not meet this condition undergo total internal reflection (TIR) and do not propagate into medium II. For conventional semiconductor LEDs, when the speed of light in medium I is significantly slower than that of medium II, $n_I \gg n_{II}$, and the interface between these media is planar or untextured, the phase-matching condition restricts transmission to rays which are incident from medium I at a narrow range of angles centered about normal incidence.

For a gallium-phosphide, GaP ($n_1$~3.3) interface with transparent epoxy ($n_2$~1.5), TIR occurs for angles of incidence, $\theta_i$, greater than the critical angle, $\theta_c = \arcsin(n_2/n_1) = 27.0°$. Only light incident within the escape cone, $\theta_i < \theta_c$, will be transmitted. For an isotropic point-source of light within the GaP, the fraction of light emitted into the escape cone at the interface is only $$\frac{1 - \cos\theta_c}{2} = 5.5\%$$

of the available emitted light. When Fresnel losses at the interface are included, approximately 4.7% of the available emitted light will be transmitted through the interface into the epoxy. For a cubic-shaped device having a completely reflective bottom surface, no top contact, and no internal absorption, there are six such interfaces and the fraction of total emitted light escaping the LED is 6×4.7%=28.2%.

The effect described above severely limits the extraction efficiency of LEDs. Typical devices generate photons at the p-n junction that are emitted into a wide range of directions (nearly isotropic emission). As a result, a large percentage of emitted light rays may be incident at the device/ambient interface at large, oblique angles. If the interface is planar or untextured, these rays undergo TIR and will not escape upon first pass and are susceptible to absorption within the device.

Several methods for improving the light extraction from an LED have been proposed. One method is to change the macroscopic geometry of the LED to allow all or most of the light generated within the device to enter an escape cone at the interface with the ambient. A preferred shape is a spherical device with a point-source active region located at the center of the sphere. All of the emitted light strikes the interface at normal incidence and escapes into the ambient with minimal Fresnel loss and no TIR. Dierschke, et al. in Applied Physics Letters 19, 98 (1971) noted large improvements in extraction efficiency for a hemispherical device. Carr in Infrared Physics 6, 1 (1966) observed that other shapes, such as truncated cones, truncated pyramids, etc. also improve extraction efficiency. Macroscopic shaping methods are costly and have associated manufacturability issues such as inefficient material utilization and complicated fabrication processes and techniques.

Another approach is to use an anti-reflective coating on the top surface of the device. The coating results in reduced Fresnel losses for light rays near normally incident at the interface. However, since the thin film coating typically maintains planarity with respect to the semiconductor surface, the effective escape cone at the device/ambient interface is not increased and this technique provides a limited improvement in light extraction.

Another prior art approach is random texturing or roughening of the surfaces of the semiconductor LED, as shown in FIG. 1 and taught by Schnitzer, et al in Applied Physics Letters 63, 2174 (1993). A random surface texture randomizes the angular distribution of light rays within the device. This randomization increases the overall probability that light will enter an escape cone after many multiple passes through the device structure. Light emitted from the active region strikes the top surface many times before entering an escape cone. In Applied Physics Letters 62, 131 (1993), Schnitzer, et al. noted that very high total external quantum efficiencies (>72%) could be realized in optically pumped structures by the extraction of multiple-pass light. In this case, careful attention was made to minimize absorption within the device. In a practical, electrically pumped device, lossy or absorptive regions within the device (e.g., absorbing substrate, active layer, defects, doped regions, etc.) or at its extremities (e.g., metal contacts, die-attach epoxy, etc.) significantly reduce the intensity of multiple-pass light rays and thus limit the extraction efficiency gains. Thus, multiple-pass light extraction techniques provide only a modest improvement since in practical devices photons are not allowed many passes through the device before being absorbed.

Another prior art method is to couple photons into surface plasmon modes (within a thin film metallic layer on the top surface) which are subsequently out-coupled into radiated modes into the ambient. Kock, et al., in Applied Physics Letters 57, 2327 (1990) taught that a periodic surface structure, shown in FIG. 2, used in combination with a thin metal film to enhance the plasmon mode coupling can improve the quantum efficiency of LEDs. These structures rely on coupling photons from the semiconductor into surface plasmons in the metallic layer which are further coupled into photons which are finally extracted. The periodic structure is a one-dimensional ruled grating with shallow groove depths (<0.1 μm). The overall external quantum efficiencies are low for these devices (1.4–1.5%) likely due to inefficiencies of photon-to-surface plasmon and surface plasmon-to-ambient photon conversion mechanisms.

An efficient method for improving light extraction from a semiconductor by favorably altering the reflection and transmission properties of the semiconductor interfaces is highly desirable.

SUMMARY OF THE INVENTION

An LED having an ordered interface texture that is periodic in at least one dimension on any or all interfaces of an LED will improve the extraction of first-pass light. Patterning the interfaces is controlled to direct more light into the ambient without requiring many multiple passes through the device in order to escape. In addition, ordered interface texturing can reduce Fresnel loss for light rays escaping into the ambient. The regularly-patterned textured interface may have feature spacings comparable to a single wavelength of light in the device. The shapes and dimensions of the texture features are chosen to optimize light extraction for the application of interest.

An ordered, controlled interface texturing can result in light extraction gains by changing or increasing the effective escape cone at the device/ambient interface. Compared to macroscopic shaping techniques, ordered texturing involves simpler fabrication processes. Fresnel losses may be reduced in much the way reflections are minimized by anti-reflective coatings. Finally, light extraction gains are provided immediately for first-pass light and do not require that light make many multiple passes within the device structure before escaping.

BRIEF DESCRIPTION OF THE DRAWINGS

FIG. 6 illustrates a conventional semiconductor light-emitting diode.

FIGS. 7a–c illustrate a method for texturing the top surface of an LED.

DETAILED DESCRIPTION OF THE PREFERRED EMBODIMENTS

The electromagnetic phase-matching conditions for a planar interface are altered when the interface is textured. An ordered textured pattern may be designed to increase first-pass light extraction and to increase power transmitted from a semiconductor into the ambient. The effects of ordered texturing of a semiconductor LED may be understood by referring to FIG. 3 which illustrates a wave-momentum or k-space diagram for an interface of GaP ($n_1 \sim 3.3$) with a transparent epoxy ($n_2 \sim 1.5$). The two media at the interface are represented by their allowed wavenumber surfaces: half-circles of radii $k_s$ and $k_e$, respectively, where $k = k_o n = 2\theta n/\lambda_o$. n is the material index of refraction, and $\lambda_o$ is the free-space wavelength of interest. Without texturing, a ray I from within the device is incident on the interface at a large, oblique angle greater than $\theta_c$ and does not satisfy the necessary phase-matching condition to allow transmission of power into the epoxy. Therefore, ray I undergoes total internal reflection and transmits its power into a reflected ray, $r_o$, back into the GaP.

Figure 1:
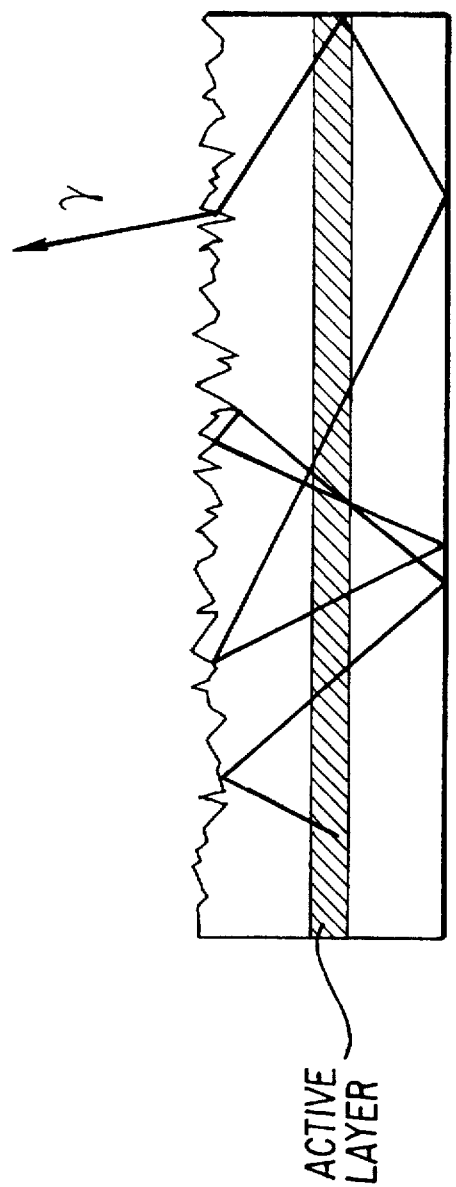
FIG. 1 illustrates a prior art example.
Figure 2:
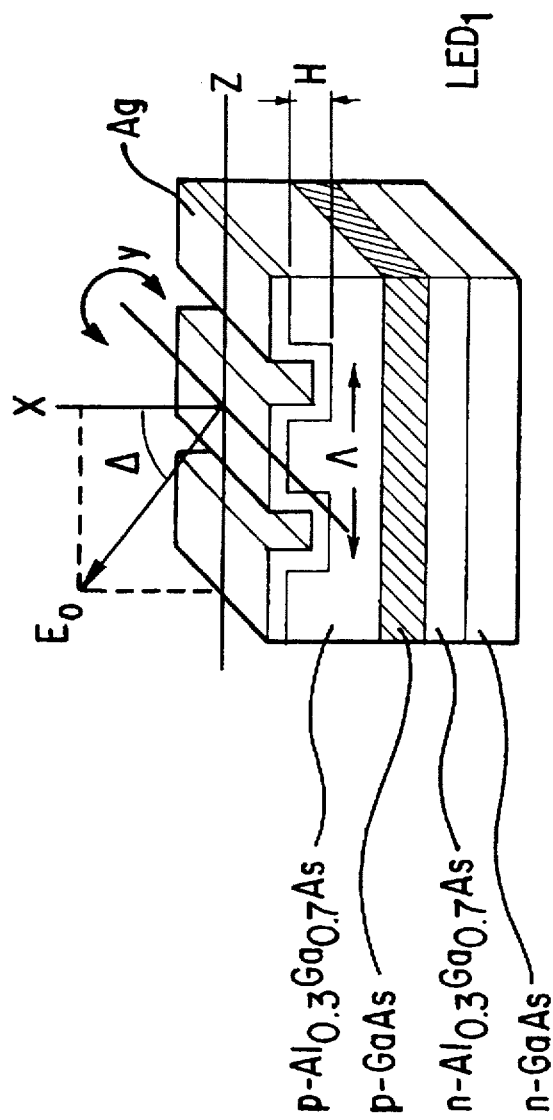
FIG. 2 illustrates another prior art example.
Figure 3:
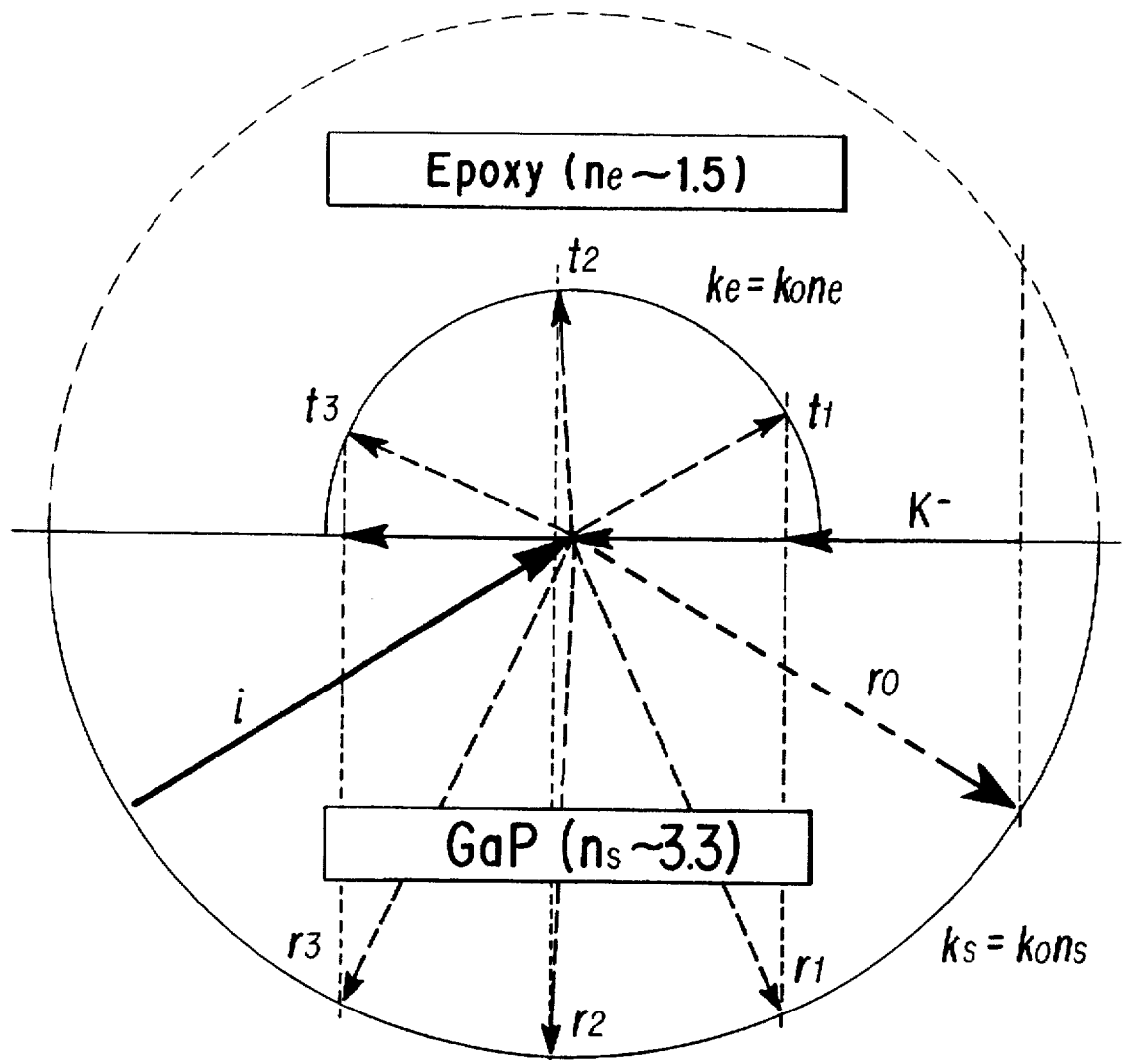
FIG. 3 illustrates a k-space diagram.

In the present invention, the periodic spacing of the ordered texturing is chosen to be sufficiently small in order to alter the phase-matching condition at the interface. In FIG. 3, a periodic texture along the interface, with wavenumber $K=2\pi/\Delta$ along the plane of incidence, imparts momentum to the incident ray and couples energy into the epoxy via transmitted modes $t_1$, $t_2$, and $t_3$. Energy is also transmitted into reflected modes $r_1$, $r_2$, . . . , back into the GaP. The periodic spacing and the shape and depth of the individual topical features of the texturing are chosen to favor power transfer into the transmitted modes.

Since light emission from the active layer is essentially three-dimensional, the interfacial texturing should preferably provide a wave-vector component along the plane of incidence for any azimuthal angle. Thus, the texturing arrangement is preferably two-dimensional along the interface, as opposed to one-dimensional like a simple ruled grating. The two-dimensional nature of the texture arrangement offers considerable flexibility. For example, the periodicity in two orthogonal directions along the plane of the interface are allowed to be different, in which case an anisotropic beam pattern may be generated. Such a beam pattern may be useful in certain applications.

The period of the ordered texturing should be short enough in order to transmit power into the ambient from rays that would normally undergo TIR at the interface, but not so short that it redirects significant amounts of light from near normally incident rays (which would otherwise escape) into TIR modes back into the device. For this same reason, "sharp" texture may be less desirable than "soft" texture features. Textures with "sharp" features are those that react with light to produce several higher-order diffracted modes. This increases the probability that significant amounts of light may be coupled into TIR modes back into the device. On the other hand, textures with "soft" features are those that redirect light primarily into lower-order diffracted modes, which should escape into the ambient in a proper texture design. A typical texture profile with "sharp" features might be a square-wave profile (with sharp corners), while an example of one with "soft" features might be a sinusoidal profile with a smooth variation along the plane of the interface.

For purposes of the present invention, an interface shall be defined as any region between dissimilar media, or any contiguous combination of such regions. Furthermore, an interface shall be specified by not only these dissimilar media, but also by its location and orientation relative to the rest of the device geometry.

Figure 4:
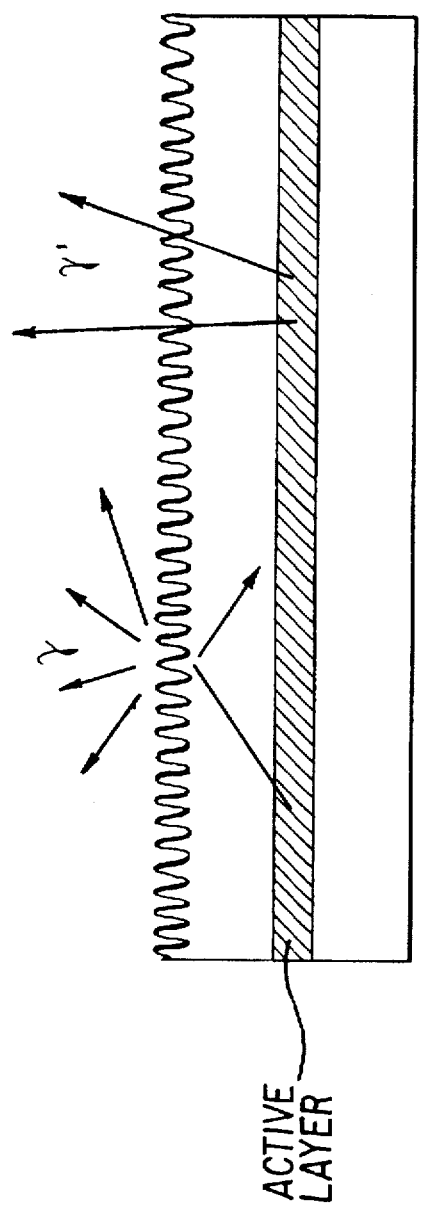
FIG. 4 illustrates a periodic texture along an interface.

FIG. 4 shows an LED with an ordered textured top surface. A light ray $\gamma$ that would normally undergo TIR instead transmits power into the ambient upon reaching the top surface. This power transfer occurs upon first pass, and reduces the probability for optical loss at absorptive regions within or at the edges of the device. The light rays ($\gamma'$) within the angular bandwidth defined by the critical angle of an untextured surface are also allowed to escape. The overall effect of the ordered texturing should be to match the active layer emission with the device geometry and surrounding ambient so as to result in a significant increase in total extraction efficiency.

Ordered texturing at the interface may also result in significantly reduced reflection losses for light rays transmitted from the device into the ambient. Gaylord et. al., in Applied Optics 25, 4562 (1986) noted that ordered surface textures will exhibit good anti-reflective characteristics over large angular bandwidths. The abruptness of the refractive index step between the device and the ambient is reduced to provide an intermediary region with an effective refractive index value graded between that of the device material and that of the ambient.

The texture pattern for optimal light depends upon the angular distribution of the light emission incident at the interface and upon the shape of the interface, both of which largely define the probability that a light ray strikes the interface at a given angle. If an LED active region consists of many (nearly) isotropic emitters, then the texture design must be such that light incident at a flat interface must be efficiently transmitted over a large range of angles, i.e., the textured-interface transmission must have a large angular bandwidth. If the emission from the active region is anisotropic, e.g. micro cavity emission, the ordered texturing should transmit efficiently within the angular bandwidth resulting from the anisotropic emission and the orientation of the interface(s).

The geometry or shape of the LED structure defines the angular light distribution that will strike any interface. In a cubic structure, a reasonable maximum angle of incidence at a top planar surface might be $$\tan^{-1}\left(\frac{\sqrt{2}a}{h}\right),$$

where $\alpha$ is the width of the cube and h is the distance from the active layer to the top surface (e.g., $\alpha$=10 mil, h=2 mil, $\theta_{max}$=82°). However, light within the critical angle at the side surfaces will escape out the side surfaces, so $\theta_{max}$=90–$\theta_c$=63° (if $n_s$=3.3, $n_c$=1.5). Thus, the ordered texturing should be designed to transmit efficiently over an angle bandwidth of –63°<$\theta$<63°.

In addition, the three-dimensional nature of the angular light distribution should be taken into account. For example, for an isotropic emitter below a planar interface, the percentage of light emitted for |$\theta$|<20° is $$\frac{1-\cos 20}{2} = 3\%.$$

This is less than that emitted for 20°<|$\theta$|<40°, which is $$\frac{\cos 20 - \cos 40}{2} = 8.7\%.$$

For 40°<|$\theta$|<60°, the percentage is $$\frac{\cos 40 - \cos 60}{2} = 13.3\%.$$

The ordered texturing of the interface can be designed to transmit light more efficiently at the larger oblique angles at the expense of smaller ones, if desired. This may be important due to the trade-off generally inherent between diffraction efficiency and angular bandwidth in diffractive structures. As a result, it may be desirable to tune the grating for maximum extraction efficiency at large oblique angles (where the majority of light is incident).

The active layer and the surrounding structures can also effect the angular light distribution incident at a interface. For a thick, absorbing active layer, light emission at larger values of $\theta$ is less likely, due to the longer probable path length within the absorbing active layer. The angular bandwidth of light incident at the top surface would be reduced relative to a thin active layer device or an active layer with high internal quantum efficiency (high probability of photon recycling).

In resonant cavity LED structures (see for example, Schubert et al., Science 265, 943 |1994|), the active layer and cavity design have strong effects in the angular light distribution. The active layer is positioned within a small vertical cavity defined by highly reflecting mirrors, which may be reflective metals, dielectric distributed-Bragg-reflector (DBR) stacks, or semiconductor DBR stacks. If the active layer is positioned at a cavity-field antinode and the DBR(s) are tuned to maximum reflectivity at normal incidence, much of the emitted light is clustered within a narrow range of angles about 0°. However, if the active layer is positioned away from a field antinode or the cavity is detuned, the angular light distribution is confined to a narrow range of off-axis angles. The percentage of total emitted light increases at more oblique angles (relative to the top surface) for a given angular light distribution, as stated earlier. If 80% of the upward emitted light could be contained narrow range of angles, for which an ordered textured interface might provide transmission at 60%, then the resulting upward extraction efficiency would be 0.8×0.6=48%.

Figure 5A:
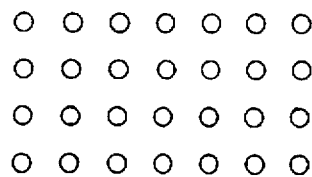
FIGS. 5a–c illustrate ordering arrangements for the periodic texture.
Figure 5B:
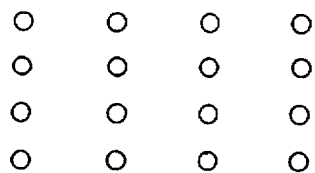
Figure 5C:
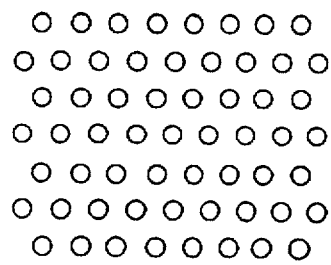

The particular shapes, dimensions, and arrangement of the ordered texturing necessary for optimum performance are application dependent. A feature shape might be cone-like protuberance or indentation. A typical ordering arrangement might be a square, rectangular, or hexagonal-close-packed (HCP) array. These arrangements are illustrated in FIGS. 5a–c, each of which show a plan-view of an ordered textured interface. The periodic spacings are preferably comparable to or less than a wavelength of light within the device. Cross-sectional profiles of the textured interface will exhibit peaks and valleys according to the protuberances or indentations, and the extent of any individual feature along the plane of the interface, as defined by its full-width-at-half-maximum (FWHM) height or depth, may also be comparable to several multiples or less than a wavelength of light within the device. The maximum height or depth of a protuberance or indentation may be comparable to one or several wavelengths of light within the device. The spacing of the ordered pattern is wavelength dependent. It is therefore critical to optimally alter the electromagnetic phase-matching condition at the interface to increase total power transmitted into the ambient. The extent and depth of the topical features of the pattern effects the efficiency of the phase condition alteration to transmit light. Also, the pattern may be chirped or otherwise interspersed with respect to its individual topical feature sizes and/or shapes in order to maximize total optical transmission and device performance.

As an example, consider visible-wavelength LEDs for which $\lambda$~400–700 nm. In this case, for the interface described in FIG. 4, the ordered texturing might exhibit a square or HCP arrangement. Features are potentially 0.1–0.9 µm in extent and on a spacing of 0.1–5.0 µm, with feature depths on the order of 0.2–15.0 µm. The period or spacing must be short enough to couple light at large oblique angles into the ambient. For typical visible-wavelength LED structures, the period will be less than 1.0 µm. The maximum depth of the features may be 0.5 µm or greater in order to achieve higher extraction efficiencies. Since the interfaces of interest are two-dimensional, the grating pattern must be two-dimensional, not one-dimensional like a simple grating.

A conventional semiconductor light-emitting device is shown in FIG. 6. It is comprised of semiconductor epitaxial layers (1) containing a p-n junction active region (2) on a substrate (3) with electrical contacts (4) provided for current injection. The electrical contacts as shown in FIG. 6 are made on both the top and bottom surfaces of the device, but it is possible to put both contacts on one side of the device to increase light extraction efficiency out the other side. In this latter case, the substrate (3) need not be conductive nor even be a semiconductor, provided that the epitaxial layers (1) may be grown upon or attached to the substrate in a satisfactory manner.

Figure 7B:
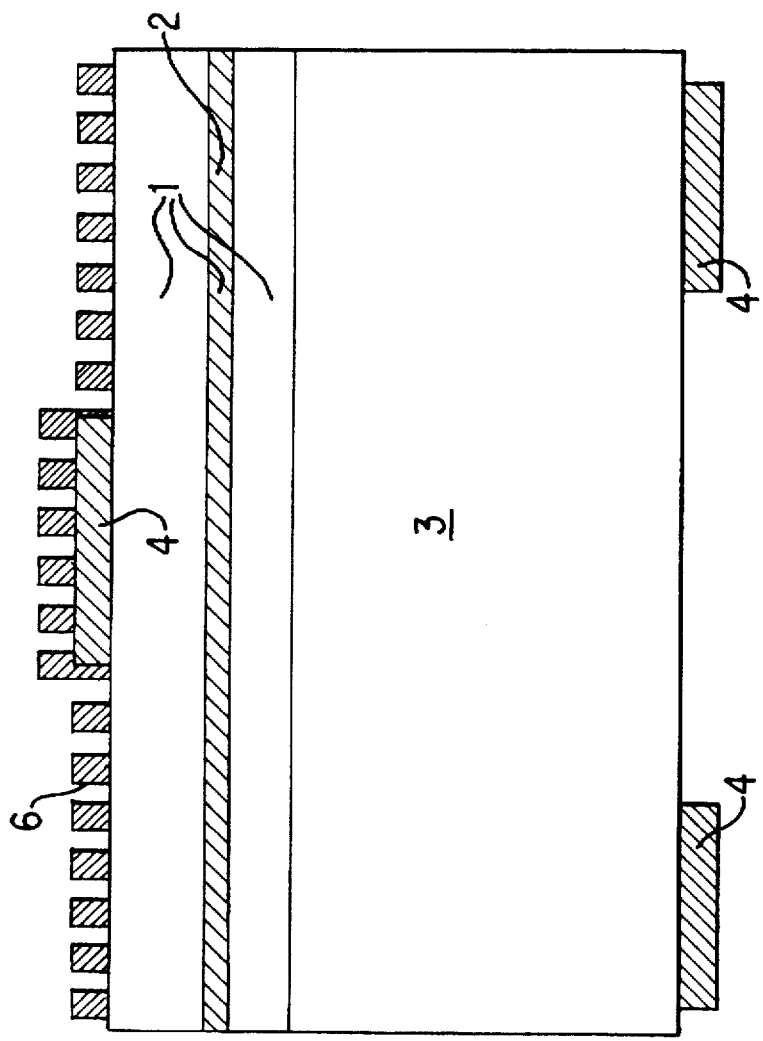

FIGS. 7a–c illustrate process flow steps for texturing the top surface of a light-emitting device. An electro-or photo-sensitive thin film (5) is applied to the top of the device (FIG. 7a). This film is exposed using electron-beam lithography, laser beam interference, or UV radiation, etc., and the desired pattern is developed (6) (FIG. 7b). After developing, the remaining masking pattern protects areas of the device material from a subsequent etching or milling process (e.g., ion milling, reactive ion etching, wet chemical etching, electrochemical etching, photochemical etching, chemical assisted ion beam etching, or combinations thereof, etc.) to transfer the desired pattern (7) into the device material, and the masking layer (6) is removed (FIG. 7c). The metal contact acts as a mask against the etching or milling process and is itself not textured. The photo-sensitive masking film (5) may be eliminated by utilizing a self-patterning etching technique (e.g., photo electrochemical etching, local laser melting and selective etching of melted regions, etc.), wherein the chemical, mechanical, or electrical state of the device material is altered according to the pattern and material is subsequently or simultaneously selectively removed to create an ordered textured interface.

Alternatively, a dielectric masking film or other thin film (metal, polymer, etc.) is applied before the photo-sensitive film. The type and thickness of this mask is selected to achieve the necessary etch ratio between the masking material and the device material in order to achieve deeply etched texturing which may be desirable for optimum light extraction. Additionally, this film may comprise part of the finished device since it is a suitable transparent window layer which may be textured to improve light extraction into the ambient. This may be useful if the index of the dielectric is greater than that of the ambient since the resulting structure will provide an increase in the effective escape cone out of the device.

Figure 8:
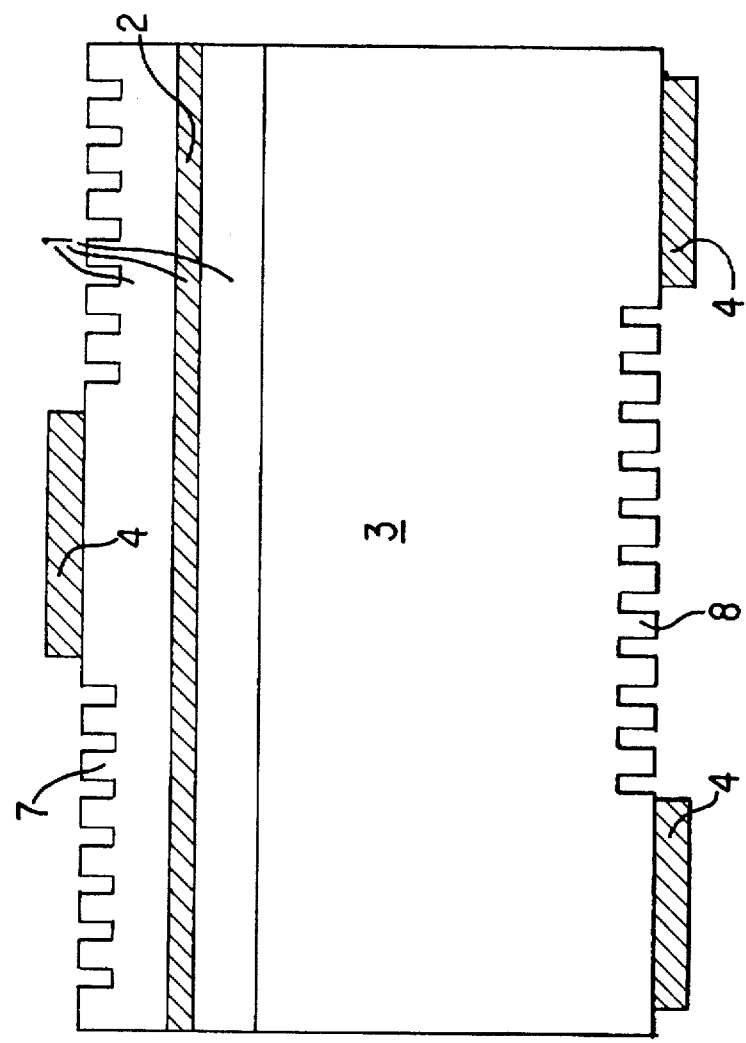
FIG. 8 illustrates a textured transparent substrate device.

FIG. 8 illustrates another embodiment wherein the top and back surfaces of a transparent substrate device are textured. Because the active region is typically heavily absorbing at the emission length, the back surface is textured (8) to redirect light that is reflected from the back surface towards the sides of the device to avoid a second pass through the active region and the top metal contact. The texturing of the top and bottom surfaces may be different since light is being redirected differently at either surface. In the case of a thin-active-layer device or one with high internal quantum efficiency (>80%), with little absorption occurring in that layer, the bottom surface texture may instead be designed to re-direct light into an escape angle at the top surface.

Figure 9:
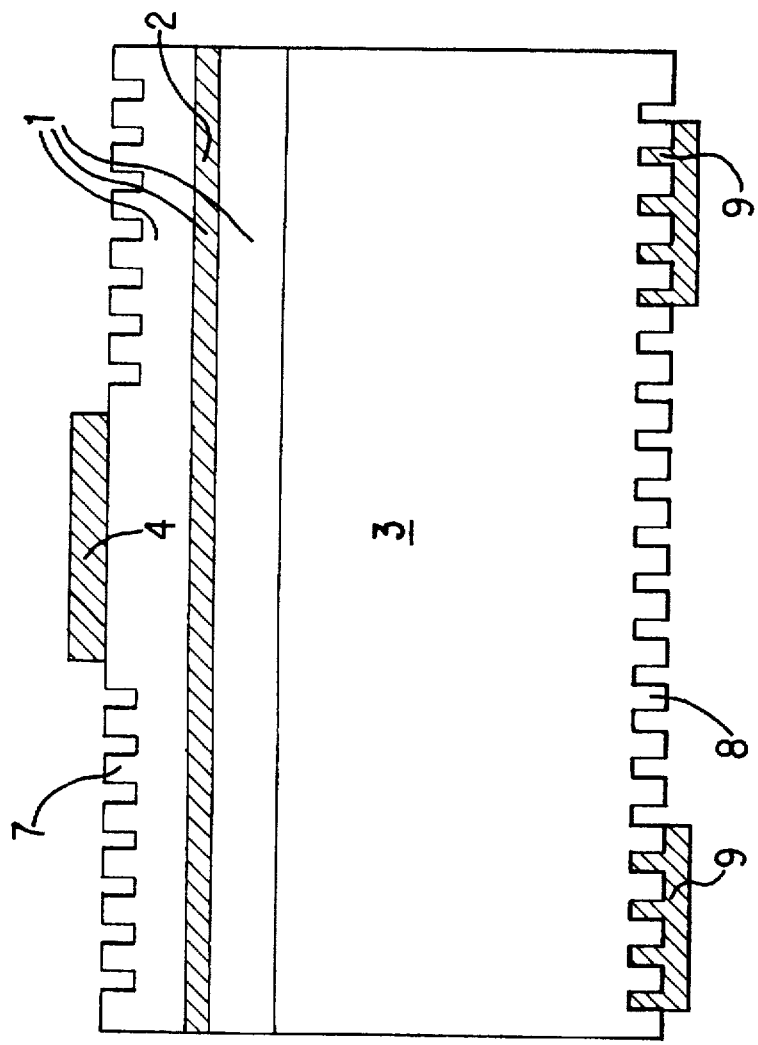
FIG. 9 illustrates another embodiment for a textured transparent substrate device.

FIG. 9 illustrates an embodiment where the back metal contacts are put down on top of the textured surface. Alternatively, the front and/or back contacts may be applied outside the textured regions. In the case of FIG. 9, the corrugation of the back metal contacts (9) offers increased surface-area for a given contact dimension and these contacts will exhibit reduced electrical resistance as compared to flat contacts of the same dimension. The corrugated contacts may be smaller in dimension relative to flat contacts for an equivalent contact resistance. They may be less absorbing than conventional flat contacts because the corrugation may act as an efficient reflective or diffractive barrier to incident light. Patterning within the contact regions may be optimized independently of the patterning on the rest of the device interfaces for increased TIR or Fresnel reflection in the contact regions in order to reduce absorption at the contacts. The optimal patterning in these regions may or may not be similar to the optimal patterning for other regions of the device.

Figure 10:
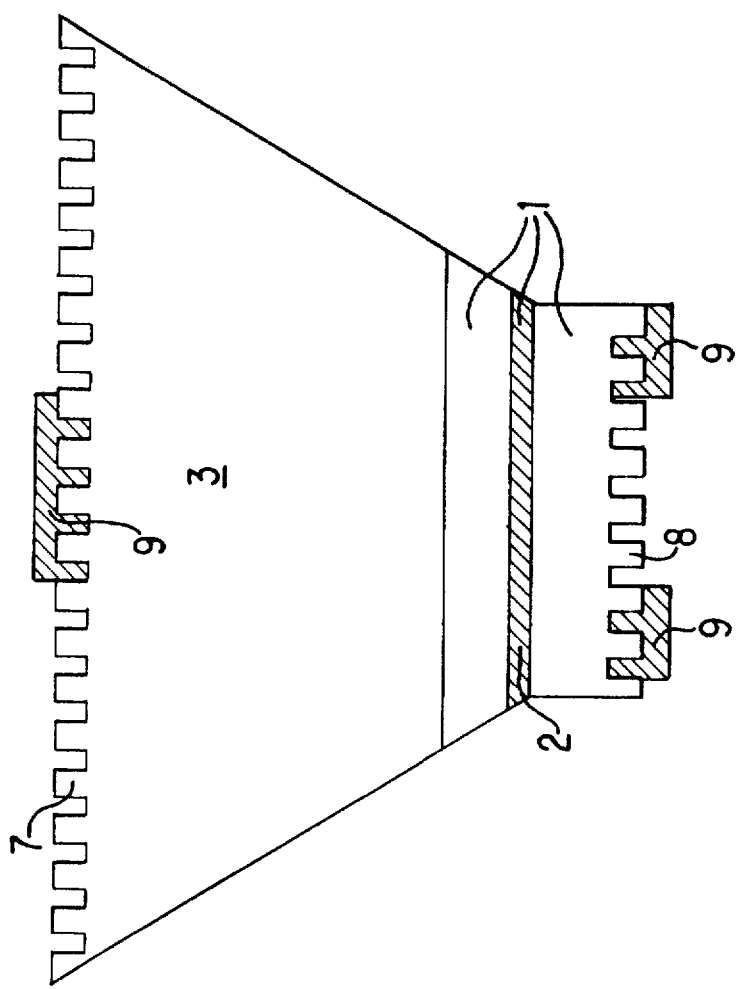
FIG. 10 illustrates another embodiment for a textured transparent substrate device.

FIG. 10 illustrates an embodiment that combines macroscopic shaping and interface texturing. Surface texturing is provided on either or both the top and the bottom of a truncated-cone-shaped light-emitting device. This transparent substrate device is mounted upside-down relative to the device of FIG. 9 to exploit the extraction gains provided by the thick cone-shaped window. Texturing may be performed on the back and designed to redirect light towards the sides of the device to avoid its passing through the absorbing active region. Alternatively, both the top and back metal contacts may be corrugated or "flat". The cone-shaped window helps to direct much of the light emitted from the active region towards the top surface at near normal incidence. This reduces the angular bandwidth of light incident at the top surface, and allows for a more efficient texturing design since, in general, there is a trade-off between diffraction efficiency and bandwidth in diffractive structures. The reverse case also holds, wherein an increase in the effective escape cone at the top surface (due to texturing) may allow relaxed design constraints in chip-shaping, leading to less costly designs. The top-surface texturing provides maximum light extraction at the wavelength and angles of interest, while the contact-area texturing may be designed to maximize reflectivity in order to reduce absorption at the metal contacts.

Figure 11:
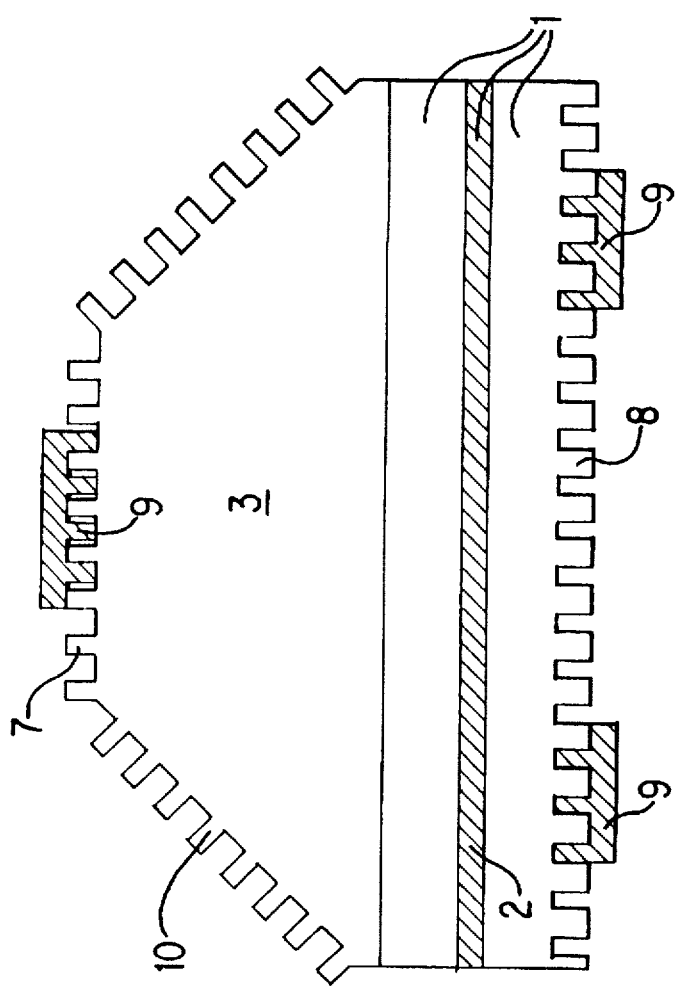
FIG. 11 illustrates another embodiment for a textured transparent substrate device.

FIG. 11 depicts an embodiment that combines ordered interface texturing with chip-shaping. A truncated-pyramid shape is chosen for its similarity to a hemisphere. Texturing is provided on at least one of the exposed surfaces. Preferably, it is performed on the beveled sides (10) of the device as well as the top and bottom to reduce Fresnel loss and increase extraction efficiency. The patterning on the beveled surfaces (10) is best effected by non-contact patterning techniques such as photochemical etching using a laser. Additional variations may include some type of ordered texturing on the extreme edges of a device as well, to alter the emission patterns and/or to further enhance extraction efficiency.

Figure 12:
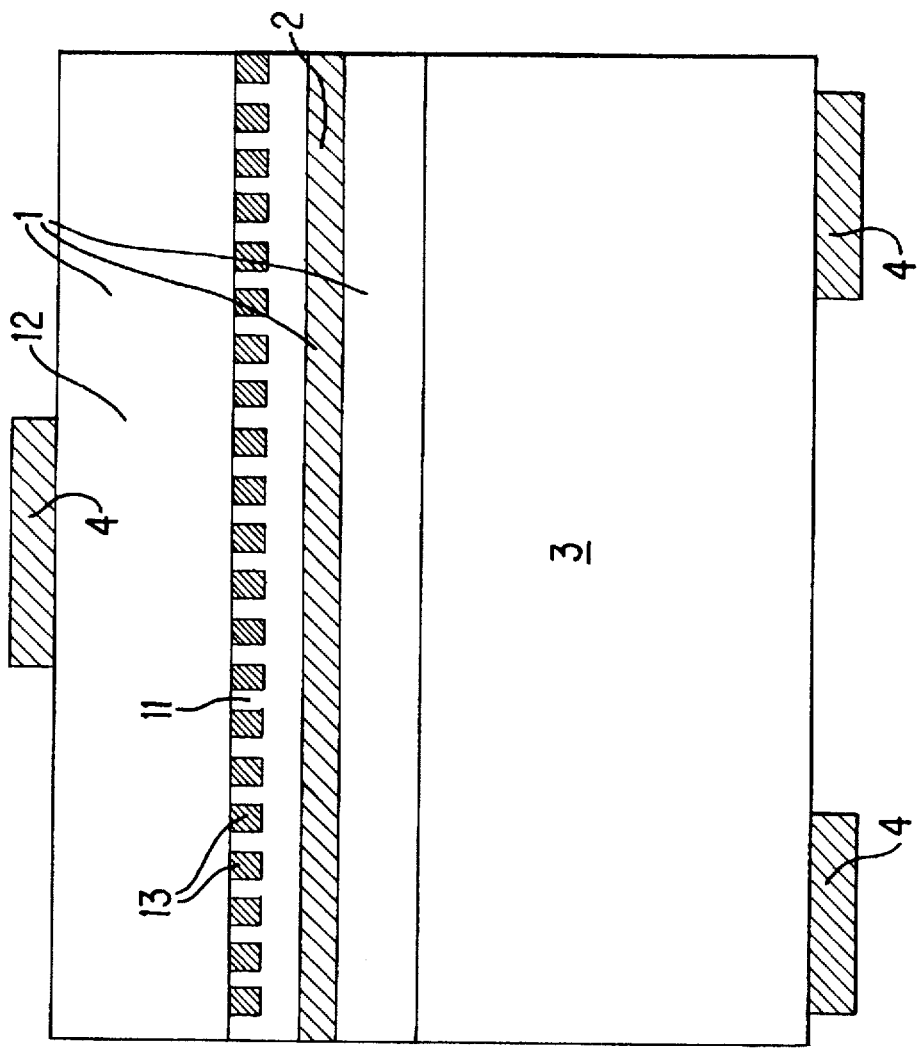
FIG. 12 illustrates another embodiment for a textured transparent substrate device.

FIG. 12 illustrates a device having an ordered textured interface near the active layer. A transparent window layer (12) is attached to the textured interface. This window layer may be provided to increase current spreading from the top contact for uniform injection into the active layer. The sandwiched interface between the window layer and the textured interface would normally consist of voids (13) but these voids may be filled with a suitable material (e.g., dielectric, semiconductor material, native oxide) before window layer attachment in order to provide structural integrity and to favorably modify the current pumping geometry of the device. The texturing and choice of "sandwiching" material should be chosen to optimize the electrical and optical characteristics of the device for the application of interest. The proximity of the ordered texturing to the active layer may result in improved light emission characteristics, wherein light is forced to emit upward from the active layer at near normal incidence to the top surface. In this latter case, the grating should be placed within ~5λ of the active region and preferably within less than ~2λ. The grating may also be placed below the active layer to redirect light upward or preferentially towards the edges of the LED.

Figure 13:
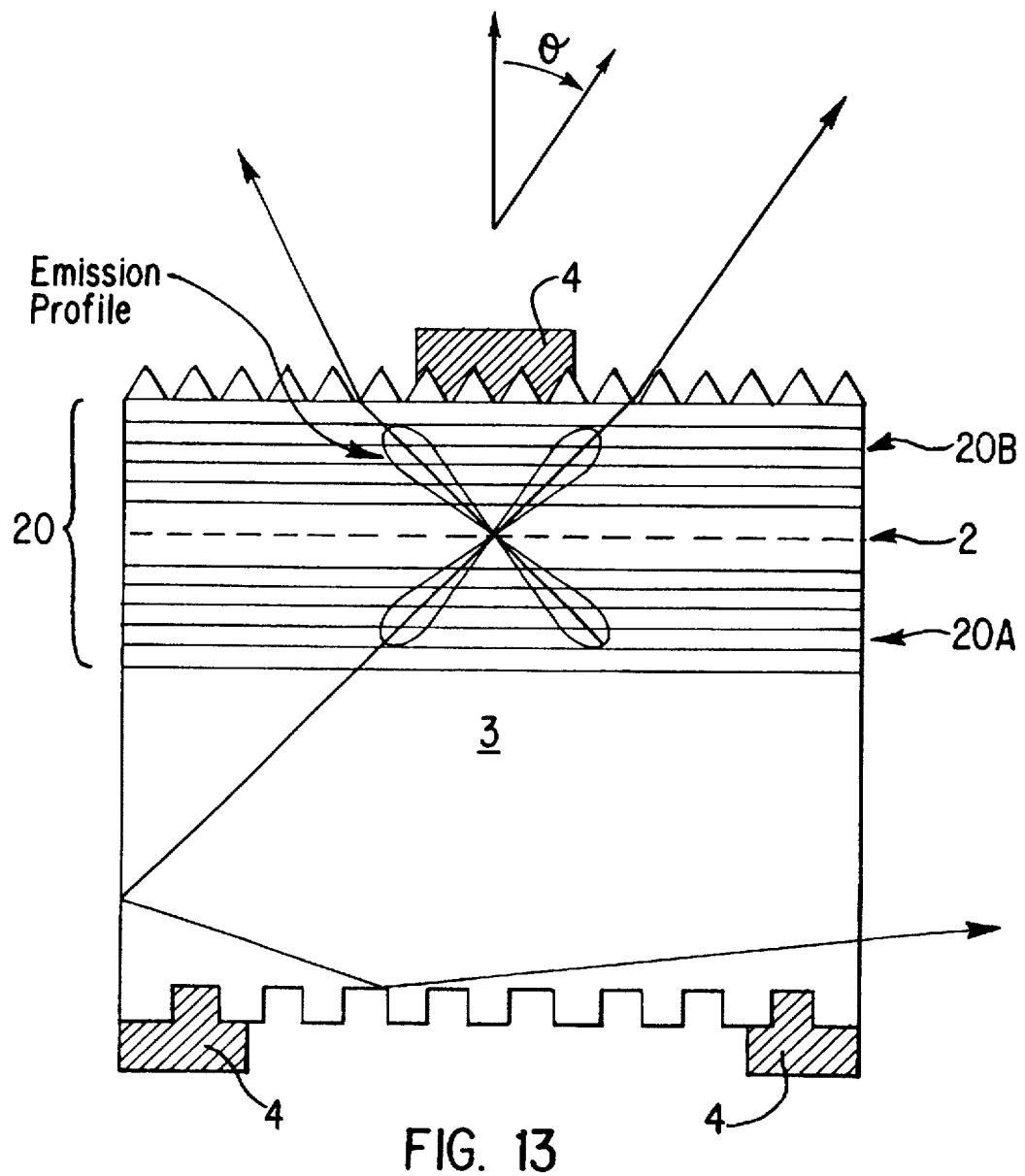
FIG. 13 illustrates a resonant cavity LED chip, comprised of two DBR mirror stacks, with ordered textured interfaces.

FIG. 13 shows an LED with a resonant cavity (RC) structure (20) consisting of an active region (2) sandwiched between two DBR mirror stacks (22A, 22B). The cavity is detuned to result in anisotropic emission from the active layer (off-axis emission). The ordered textured top surface is designed to efficiently couple this light out into the ambient. If the device is mounted on a transparent substrate, the bottom surface may be textured to preferentially direct light into escape cones at the sides of the device. Additionally, the textured interfaces may be instead embedded within the device at interfaces nearer the active region.

Figure 14:
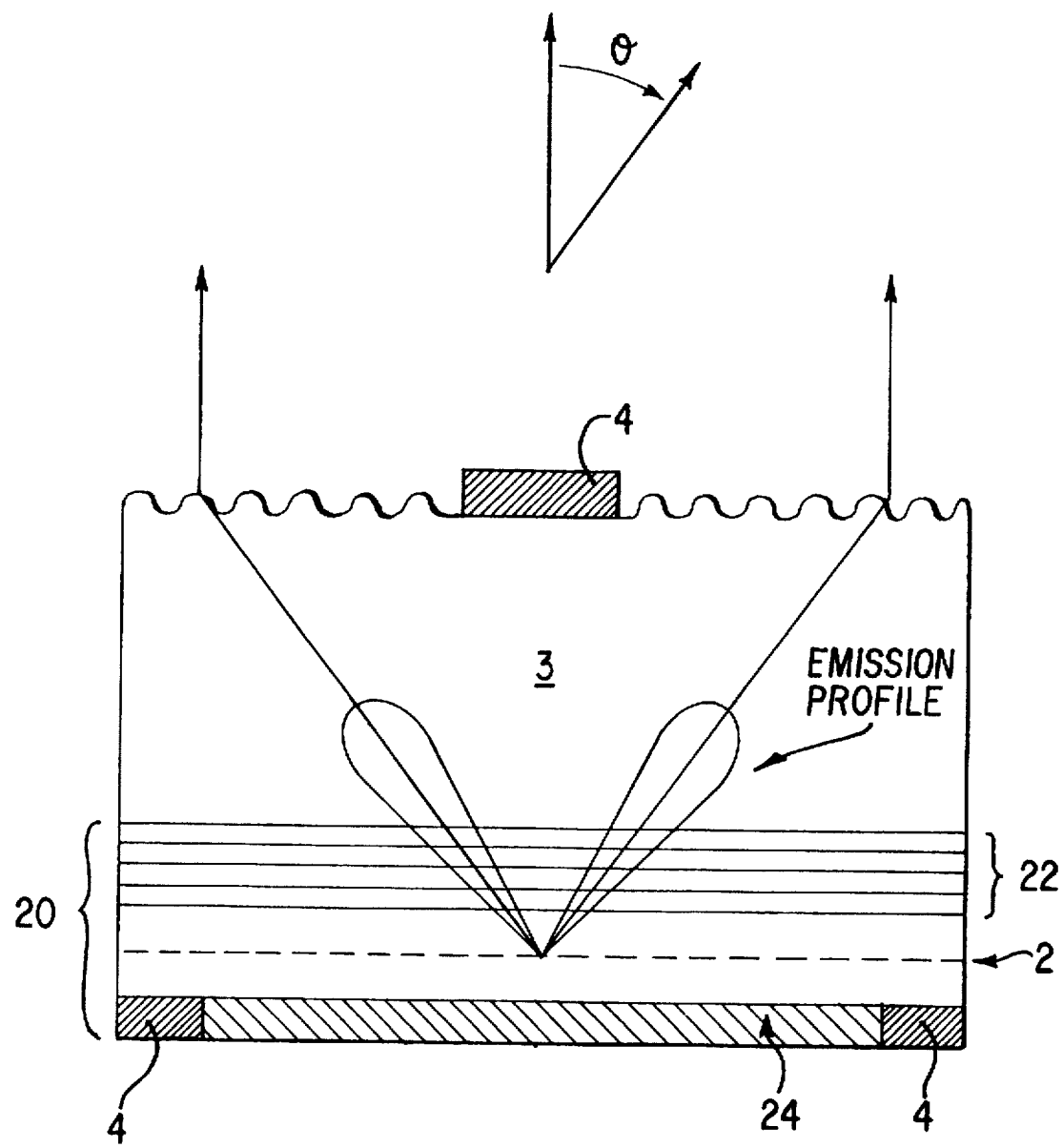
FIG. 14 illustrates a resonant cavity LED chip, comprised of one DBR stack and one metal mirror, with an ordered textured interface on the transparent substrate surface.

FIG. 14 shows an RCLED where one side of the cavity (20) is defined by a high-reflectivity metal mirror (24) and the other side is a DBR stack (22). The device is mounted with the (transparent) substrate on top. The cavity is detuned for off-axis emission and the top surface is textured to provide efficient coupling of the emission into the ambient. Additionally, the RCLED devices of FIGS. 13 and 14 may be shaped (in addition to texturing) to optimally out-couple light from the off-axis emission.

What is claimed is:

1. A light emitting device comprising:
    a device that includes,
        a substrate,
        a p-n junction region having multiple layers, wherein subsets of the multiple layers have opposing polarity such that a p-n junction is formed, one of the layers being adjacent the substrate,
        a transparent window layer, positioned adjacent the p-n junction region, and
        electrical contacts, connecting to the p-n junction region, being operative to forward bias the p-n junction; and
    a primary interface, positioned in the device, that is textured with repeated features in at least one selected direction, having an associated periodicity in each of the selected directions to increase light extraction and, within a period, having a cross-sectional profile having at least one peak and at least one valley.

2. A light emitting device, as defined in claim 1, wherein the primary interface has repeated features in at least two selected directions that have identical periodicities.

3. A light emitting device, as defined in claim 1, wherein the primary interface has repeated features that form a rectangular array.

4. A light emitting device, as defined in claim 1, wherein the primary interface has repeated features that form a hexagonally close-packed pattern.

5. A light emitting device, as defined in claim 1, wherein the maximum peak-to-valley depth is between 0.2 and 15 microns.

6. A light emitting device, as defined in claim 1, wherein the periodicities have associated periods between 0.1 and 5.0 microns.

7. A light emitting device, as defined in claim 1, wherein the valley is within 2 microns of the p-n junction region.

8. A light emitting device, as defined in claim 1, wherein the peaks and valleys of the cross-sectional profile of the primary interface have full-width-at-half-maximum of 10-90% of one period of the textured arrangement.

9. A light emitting device, as defined in claim 1, wherein a portion of the primary interface is electrically conducting.

10. A light emitting device, as defined in claim 1, further comprising a metallic film at a portion of the primary interface.

11. A light emitting device, as defined in claim 1, wherein at least some portion of the valley is filled in by a material having an index of refraction less than 2.0.

12. A light emitting device, as defined in claim 11, wherein:
    the material having an index of refraction less than 2.0 is a dielectric material; and
    the device further including a layer of metal positioned over the dielectric material.

13. A light emitting device, as defined in claim 1, further comprising:
    N secondary interfaces (where N≧1), positioned in the device, wherein each of the secondary interfaces is textured with repeated features in at least one selected direction, having a periodicity in each selected direction to increase light extraction and, within any period, having a cross-sectional profile having at least one peak and at least one valley.

14. A light emitting device, as defined in claim 13, wherein at least one of the N secondary interfaces and the primary interface have different cross-sectional profiles.

15. A light emitting device, as defined in claim 13, wherein at least one of the N secondary interfaces and the primary interface are textured with different periodicities.

16. A method for manufacturing a textured interface for a light emitting device made by the steps of:
    transferring at least one pattern to at least one interface of the device, wherein each pattern has repeating features having a periodicity in all directions and
    removing some of the device material according to the pattern to create an interface that is textured with the repeating features having a periodicity in all of the directions, wherein the periodicity for at least two of the directions has an associated period between 0.1 and 5.0 microns.

17. A method, as defined in claim 16, wherein the step of transferring the pattern comprises the steps of:
    depositing a layer of photoresist over the interface of the device;
    exposing a portion the layer of photoresist to create the pattern; and
    removing the unpatterned regions of photoresist to create the masking layer.

18. A method, as defined in claim 16, wherein the transferring the pattern comprises the steps of:
    depositing a layer of dielectric material over the interface of the device;
    depositing a layer of photoresist over the layer of dielectric material;
    exposing a portion of the layer of photoresist to create the pattern;
    removing the unpatterned regions of photoresist; and
    etching the layer of dielectric material according to the pattern.

19. A method for manufacturing a textured interface for a light emitting device made by the steps of:
    transferring at least one pattern to at least one interface of the device, wherein each pattern has repeating features having a periodicity in at least one selected direction;
    removing some of the device material according to the pattern to create an interface that is textured with the repeating features having a periodicity in at least one direction; and
    filling in the at least some portion of interface using a material having a refractive index less than 3.

20. A method for manufacturing a textured interface for a light emitting device made by the steps of:

transferring at least one pattern to at least one interface of the device, wherein each pattern has repeating features having a periodicity in at least one selected direction;

removing some of the device material according to the pattern to create an interface that is textured with the repeating features having a periodicity in at least one direction; and applying electrical contacts to the interface.

21. A method, as defined in claim 16, wherein the step of transferring the pattern comprises the step of modifying the state of the device material according to a pattern, wherein the pattern has repeating features having a periodicity in at least one direction.

22. A method, as defined in claim 21, wherein the step of modifying and the step of removing are performed simultaneously.

* * * * *